(12) United States Patent
Cha et al.

(10) Patent No.: US 9,570,308 B2
(45) Date of Patent: *Feb. 14, 2017

(54) METHOD OF FORMING REGIONS WITH HOT AND COLD IMPLANTS

(71) Applicant: SK hynix Inc., Gyeonggi-do (KR)

(72) Inventors: Jae-Chun Cha, Gyeonggi-do (KR); Seung-Woo Jin, Gyeonggi-do (KR); An-Bae Lee, Gyeonggi-do (KR); Il-Sik Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/968,012

(22) Filed: Dec. 14, 2015

(65) Prior Publication Data

US 2016/0099152 A1 Apr. 7, 2016

Related U.S. Application Data

(63) Continuation of application No. 14/457,904, filed on Aug. 12, 2014, now Pat. No. 9,245,756.

(30) Foreign Application Priority Data

Mar. 10, 2014 (KR) .................. 10-2014-0027940

(51) Int. Cl.
*H01L 21/265* (2006.01)
*H01L 29/66* (2006.01)
*H01L 21/8238* (2006.01)
*H01L 29/78* (2006.01)
*H01L 29/08* (2006.01)
*H01L 29/10* (2006.01)
*H01L 29/167* (2006.01)

(52) U.S. Cl.
CPC ... *H01L 21/26593* (2013.01); *H01L 21/26513* (2013.01); *H01L 21/823807* (2013.01); *H01L 21/823814* (2013.01); *H01L 29/0847* (2013.01); *H01L 29/1033* (2013.01); *H01L 29/167* (2013.01); *H01L 29/6659* (2013.01); *H01L 29/66522* (2013.01); *H01L 29/66568* (2013.01); *H01L 29/7833* (2013.01); *H01L 21/2658* (2013.01); *H01L 29/665* (2013.01)

(58) Field of Classification Search
CPC .................. H01L 29/66522; H01L 21/26593
See application file for complete search history.

(56) References Cited

U.S. PATENT DOCUMENTS

| | | | | |
|---|---|---|---|---|
| 6,319,798 B1* | 11/2001 | Yu | ........................ | H01L 29/6659 |
| | | | | 257/E21.335 |
| 9,245,756 B2* | 1/2016 | Cha | .................... | H01L 21/26593 |
| 2011/0033998 A1* | 2/2011 | Hatem | ................ | H01L 21/2236 |
| | | | | 438/302 |
| 2012/0208333 A1* | 8/2012 | Lee | ................. | H01L 21/823814 |
| | | | | 438/231 |
| 2015/0255289 A1* | 9/2015 | Yin | ................... | H01L 21/26593 |
| | | | | 438/166 |

* cited by examiner

*Primary Examiner* — Matthew Landau
*Assistant Examiner* — Grant Withers
(74) *Attorney, Agent, or Firm* — IP & T Group LLP

(57) ABSTRACT

A method for fabricating a semiconductor device includes: implanting a first species into a substrate at a cold temperature to form a first region; and implanting a second species into the substrate at a hot temperature to form a second region that is adjacent to the first region.

8 Claims, 15 Drawing Sheets

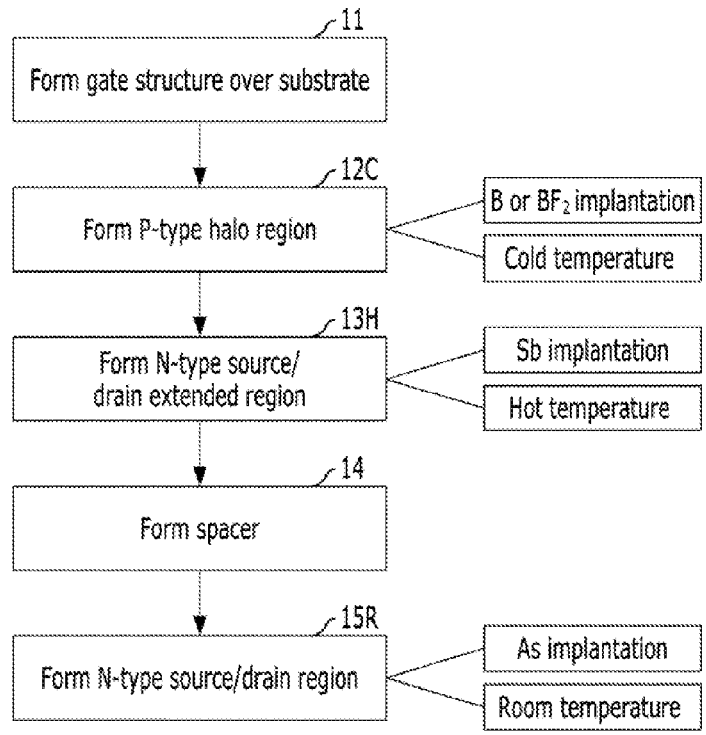
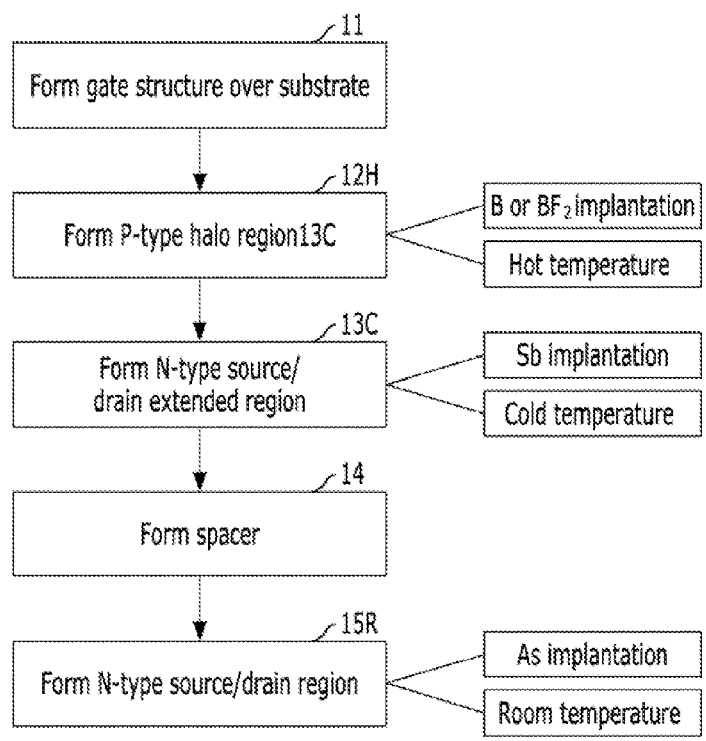

METHOD OF FORMING REGIONS WITH HOT AND COLD IMPLANTS

CROSS-REFERENCE TO RELATED APPLICATIONS

This application is a continuation of U.S. patent application Ser. No. 14/457,904 filed on. Aug. 12, 2014, which claims priority of Korean Patent Application No, 10-2014-0027940, filed on Mar. 10, 2014. The disclosure of each of the foregoing applications is incorporated herein by reference in its entirety.

BACKGROUND

1. Field

Exemplary embodiments of the present invention relate to an electronic device, and more particularly, to a semiconductor device and a method for fabricating the same.

2. Description of the Related Art

An electronic device includes a plurality of transistors. Currently, transistors continue to be scaled down, and it is important to develop a method for improving the performance of the transistors in an industrial environment where the transistors are being scaled down continuously. For example, it is necessary to improve an on-current of the transistor.

SUMMARY

Exemplary embodiments of the present invention are directed to a transistor capable of restraining a short-channel effect and improving an on-current in the industrial environment where the transistor continues to be scaled down, and a method for fabricating the transistor.

In accordance with an embodiment of the present invention, a method for fabricating a semiconductor device includes: implanting a first species into a substrate at a cold temperature to form a first region; and implanting a second species into the substrate at a hot temperature to form a second region that is adjacent to the first region. The cold temperature is in the range of approximately −200° C. to approximately 0° C., and the hot temperature is in the range of approximately 50° C. to approximately 500° C.

In accordance with another embodiment of the present invention, a method for fabricating a transistor includes: forming a gate structure over a substrate; implanting a first species into the substrate at a cold temperature to form a source/drain extended region of a first conductive type by using the gate structure as a mask; implanting a second species into the substrate at a hot temperature to form a halo region of a second conductive type that is opposite to the first conductive type; and implanting a third species into the substrate to form a source/drain region of the first conductive type.

In accordance with another embodiment of the present invention, a method for fabricating a transistor including a gate structure, a source/drain extended region and a halo region, the method includes: performing a hot temperature implantation using a first species to form the source/drain extended region having a broadened doping profile, wherein the hot temperature implantation performed at a temperature higher than a room temperature; and performing a cold temperature implantation using a second species to form the halo region having a suppressed doping profile, wherein the cold temperature implantation performed at a temperature lower than the room temperature.

In accordance with another embodiment of the present invention, a transistor includes: a substrate; a gate structure formed over the substrate; a source/drain extended region formed in the substrate on both sides of the gate structure, wherein the source/drain extended region has a broadened doping profile of antimony (Sb); a sidewall spacer formed on the sidewalls of the gate structure; a source/drain region, which aligns to the sidewall spacer in the substrate; and a halo region covering a side portion and a bottom portion of the source/drain extended region and having a suppressed doping profile of boron (B).

BRIEF DESCRIPTION OF THE DRAWINGS

FIGS. 2 to 7 are flowcharts illustrating various methods for fabricating the transistor in accordance with the first embodiment of the present invention.

DETAILED DESCRIPTION

Figure 1A:
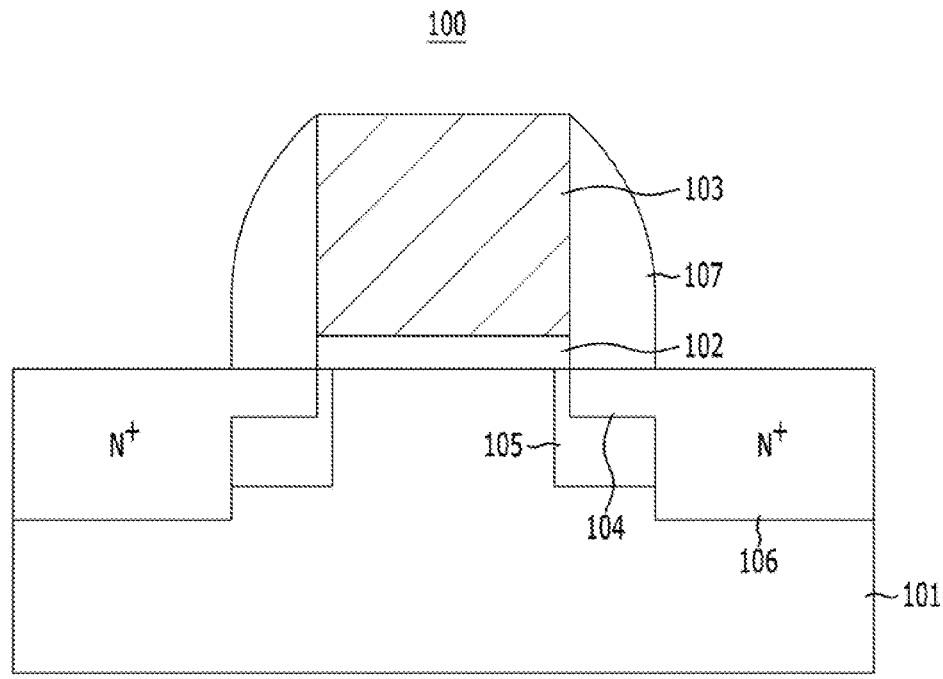
FIG. 1A illustrates a transistor in accordance with a first embodiment of the present invention.

Various examples and implementations of the disclosed technology are described below in detail with reference to the accompanying drawings.

The drawings may not be necessarily to scale and in some instances, proportions of at least some of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. Throughout the disclosure, like reference numerals refer to like parts in the various figures and embodiments of the present invention.

In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
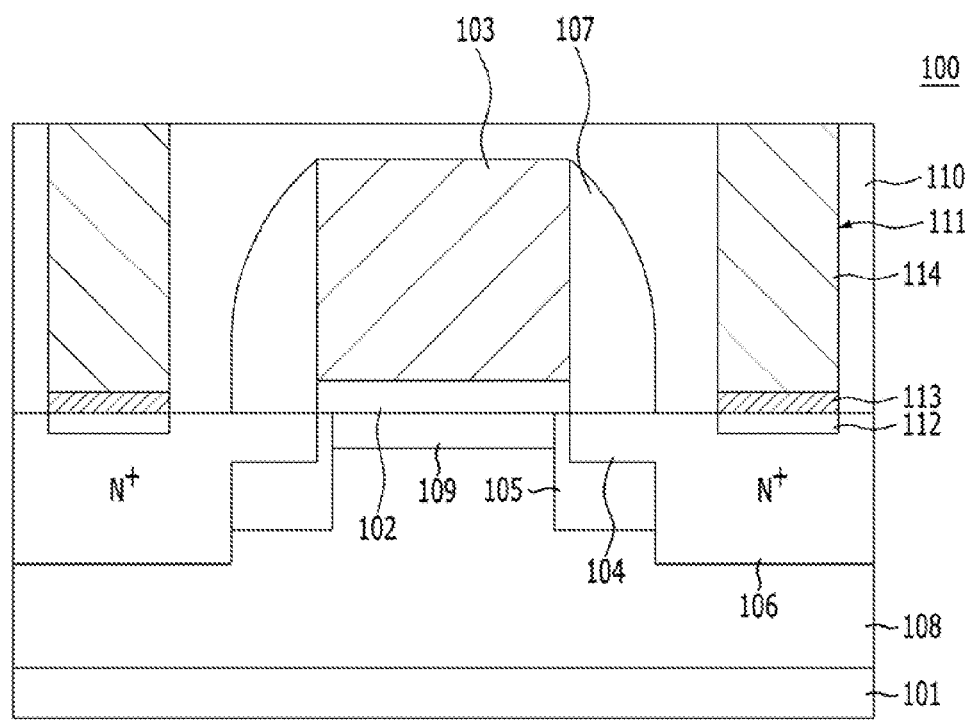
FIG. 1B illustrates a transistor in accordance with a modified example of the first embodiment of the present invention.

FIG. 1A illustrates a transistor in accordance with a first embodiment of the present invention. FIG. 1B illustrates a transistor in accordance with a modified example of the first embodiment of the present invention.

Referring to FIG. 1A, a transistor 100 includes a gate structure including a gate electrode 103, an N-type source/drain extended region 104, a P-type halo region 105, and an N-type source/drain region 106.

The gate structure is formed over a substrate 101. The substrate 101 may include a semiconductor substrate. The substrate 101 may include a silicon substrate, a silicon-germanium substrate or a silicon on insulator (SOI) substrate. Herein, in the embodiment of the present invention, the substrate 101 may include the silicon substrate.

The gate structure may further include a gate insulation layer 102. The gate insulation layer 102 is formed over the substrate 101, and the gate electrode 103 is formed over the gate insulation layer 102. A spacer (i.e., a sidewall spacer) 107 is formed on the sidewalls of the gate structure. The gate insulation layer 102 may include at least one selected among a high-k material, an oxide, a nitride and an oxynitride. The high-k material may be a dielectric material having a higher dielectric constant than an oxide and a nitride. For example, the high-k material may be at least one selected among a metal oxide such as a hafnium oxide or an aluminum oxide. The gate electrode 103 may include at least one selected among polysilicon, a metal and a metal compound. The gate electrode 103 may be formed of a work function material capable of modulating a threshold voltage of the transistor 100.

The N-type source/drain extended region 104 is formed in the substrate 101 of both sides of the gate structure. The N-type source/drain region 106 is formed to be adjacent to the N-type source/drain extended region 104. The P-type halo region 105 is formed below the N-type source/drain extended region 104. The N-type source/drain extended region 104 is formed to be aligned to the gate electrode 103 in the substrate 101. The N-type source/drain region 106 is formed to be aligned to the gate electrode 103 and the spacer 107 in the substrate 101. The N-type source/drain extended region 104 has a first depth, and the N-type source/drain region 106 has a second depth deeper than the first depth. The P-type halo region 105 may have a third depth deeper than the first depth and is shallower than the second depth. The P-type halo region 105 may cover a side portion and a bottom portion of the N-type source/drain extended region 104. A first species is introduced to the N-type source/drain extended region 104. A second species is introduced to the P-type halo region 105. A third species is introduced to the N-type source/drain region 106. The first species and the third species may include a group III element, and the second species may include a group V element. The first species and the third species may be the same element or different elements. The first species may include antimony (Sb), and the third species may include arsenic (As) or antimony (Sb). The second species may include boron (B), indium (In) or a mixture of boron and indium. The N-type source/drain extended region 104 is doped with the first species of a relatively low concentration. The N-type source/drain region 106 is doped with the third species of a relatively high concentration.

As widely known, the N-type source/drain extended region 104 may be referred to as an N-type Lightly Doped Drain (LDD) region. The N-type source/drain region 106 may be referred to as an N-type deep source/drain region, and the N-type source/drain extended region 104 may be referred to as an N-type shallow source/drain region. The P-type halo region 105 may be referred to as a P-type pocket region. The first species, the second species and the third species may be referred to as dopants or impurities. The transistor 100 becomes an N-channel transistor. There is limitation in that only the N-type source/drain extended region 104 restrains a short-channel effect. The short-channel effect may be greatly restrained by forming the P-type halo region 105, which covers the N-type source/drain extended region 104.

An implantation of the species may be performed to form the N-type source/drain extended region 104, the P-type halo region 105 and the N-type source/drain region 106.

A hot temperature implantation or a cold temperature implantation may be performed to form the N-type source/drain extended region 104 and the P-type halo region 105. A room temperature implantation, the hot temperature implantation or the cold temperature implantation may be performed to form the N-type source/drain region 106. The hot temperature implantation is a process in which the species is implanted at a temperature higher than a room temperature. The cold temperature implantation is a process in which the species is implanted at a temperature lower than a room temperature. The hot temperature implantation may be performed in the range of approximately 50° C. to approximately 500° C. The cold temperature implantation may be performed in the range of approximately −200° C. to approximately 0° C.

When the species is doped by the hot temperature implantation, a tail of a doping profile may be formed more broadly than when the room temperature implantation is performed. Therefore, the species, which is implanted by the hot temperature implantation, may have a broadened doping profile.

When the species is doped through the cold temperature implantation, the implanted species may be restrained from diffusing in a vertical direction and in a horizontal direction. Therefore, although an absolute concentration of the implanted species is decreased lower than when the room temperature implantation is performed, an effective concentration may be maintained the same as when the room temperature implantation is performed. The effective concentration means a concentration of the species, which contributes to conductivity except for an offset of an N-type species and a P-type species. In comparison with the room temperature implantation, the species, which is implanted through the cold temperature implantation, may have a steep doping profile, which is referred to as a suppressed doping profile.

As described above, a hybrid implantation where the cold temperature implantation and the hot temperature implantation are combined, is performed to form the N-type source/drain extended region 104 and the P-type halo region 105. The electric field crowding of a region, where a PN junction is formed, is relaxed through the hot temperature implantation, and the concentration is reduced through the cold temperature implantation. As a result, a gate-induced drain leakage (GIDL) may be improved through the hybrid implantation without deterioration of a short-channel margin.

The hybrid implantation in accordance with the embodiment of the present invention, may improve the GIDL more greatly than the room temperature implantation. Additionally, the hybrid implantation may improve the GIDL more greatly than a mixture of the cold temperature implantation and the room temperature implantation, and a mixture of the hot temperature implantation and the room temperature implantation.

Referring to FIG. 1B, a P-type well region 108 is formed in the substrate 101. An N-channel region 109 is formed in the P-type well region 108 below the gate structure. A contact plug 114 is formed over the N-type source/drain region 106. A contact hole 111, which is formed in an inter-layer dielectric layer 110, is filled with the contact plug 114. A metal silicide layer 113 is formed between the contact plug 114 and the N-type source/drain region 106. A contact junction region 112 is formed between the metal silicide layer 113 and the N-type source/drain region 106. The P-type well region 108, the N-channel region 109 and the contact junction region 112 may be formed through the implantation of the species. The room temperature implantation, the hot temperature implantation and the cold temperature implantation may be selectively performed to form the P-type well region 108, the N-channel region 109 and the contact junction region 112. For example, the hot temperature implantation or cold temperature implantation of a P-type species may be selectively performed to the N-channel region 109 and the P-type well region 108.

As described above, an off-leakage and a GIDL may be improved by controlling a defect when the hot temperature implantation or the cold temperature implantation is performed to the N-channel region 109 and the P-type well region 108. Additionally, a short-channel margin such as a Drain-Induced Barrier Lowering (DIBL) may be improved by controlling a dopant profile. Furthermore, the mobility based on a decrease in a counter-type dopant distribution of the N-channel region 109 may be improved.

A contact resistance may be improved by performing the hot temperature implantation or the cold temperature implantation on the contact junction region 112. For example, by improving a doping profile the contact resistance may be improved. That is, a doping concentration on the interface of the metal silicide layer 113 and the N-type source/drain region 106 may be optimized. Also, the contact resistance by a Schottky Barrier Height Lowering (SBHL) may be improved. Furthermore, the contact resistance by a combined implantation of As and Sb or Sb and P may be improved. Herein, antimony (Sb) may be a pre-amorphization implantation.

FIGS. 2 to 7 are flowcharts describing a method for fabricating the N-channel transistor in accordance with a first embodiment of the present invention.

Referring to FIG. 2, a gate structure is formed over a substrate in step 11.

A P-type halo region is formed in the substrate in step 12C. An implantation of a P-type species is performed to form the P-type halo region. For example, an implantation of boron (B) or boron difluoride ($BF_2$) is performed to form the P-type halo region. The P-type halo region may be formed through a cold temperature implantation. The species, which is implanted through the cold temperature implantation, may be restrained from diffusing in a vertical direction and in a horizontal direction. The cold temperature implantation may be performed in the range of approximately −200° C. to approximately 0° C. In another embodiment of the present invention, the cold temperature implantation of indium (In) may be performed to form the P-type halo region. In another embodiment of the present invention, the cold temperature implantation of a mixture of boron (B) and indium (In) may be performed to form the P-type halo region. For example, a boron (B) implantation and an indium (In) implantation may be sequentially performed at a cold temperature.

An N-type source/drain extended region is formed in step 13H. An implantation of an N-type species is performed to form the N-type source/drain extended region. The implantation may be performed by using the gate structure as a mask. An antimony (Sb) implantation may be performed to form the N-type source/drain extended region. The N-type source/drain extended region may be formed through a hot temperature implantation of antimony (Sb). The antimony (Sb), which is implanted through the hot temperature implantation, contribute to a broad tail of a doping profile. That is, a doping profile of a region, where a PN junction is formed, may be formed broadly. Therefore, a GIDL may be improved by reducing an electric field. The hot temperature implantation may be performed in the range of approximately 50° C. to approximately 500° C. A resistance component of the N-type source/drain extended region may be reduced through the antimony (Sb) implantation. Consequently, an on-current increases. However, since an atomic mass unit of antimony (Sb) is relatively larger than arsenic (As), a super steep retrograde (SSR) profile is formed, and an electric field crowding effect occurs. The electric field crowding effect causes GIDL. In the embodiment of the present invention, the hot temperature implantation of antimony (Sb) is performed to restrain the GIDL.

A spacer (i.e., a sidewall spacer) is formed on the sidewalls of the gate structure in step 14. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

An N-type source/drain region is formed in step 15R. An implantation of an N-type species is performed to form the N-type source/drain region. The implantation may be performed by using the gate structure and the spacer as masks. Arsenic (As) may be implanted to form the N-type source/drain region. The N-type source/drain region may be formed through a room temperature implantation of arsenic (As). The room temperature implantation may be performed in the range of approximately 0° C. to approximately 30° C.

According to FIG. 2, the cold temperature implantation is performed to form the P-type halo region, and the hot temperature implantation is performed to form the N-type source/drain extended region. The room temperature implantation is performed to form the N-type source/drain region.

A method for fabricating the N-channel transistor shown in FIG. 3 is similar to the method shown in FIG. 2.

Referring to FIG. 3, a gate structure is formed over a substrate in step 11.

A P-type halo region is formed in the substrate in step 12H. An implantation of a P-type species is performed to form the P-type halo region. For example, an implantation of boron (B) or boron difluoride ($BF_2$) is performed to form the P-type halo region. The P-type halo region may be formed through a hot temperature implantation. In another embodiment of the present invention, the hot temperature implantation of indium (In) may be performed to form the P-type halo region. In another embodiment of the present invention, the hot temperature implantation of a mixture of boron (B) and indium (In) may be performed to form the P-type halo region. The hot temperature implantation may be performed in the range of approximately 50° C. to approximately 500° C.

An N-type source/drain extended region is formed in step 13C. An implantation of an N-type species is performed to form the N-type source/drain extended region. The implantation may be performed by using the gate structure as a mask. An antimony (Sb) implantation may be performed to form the N-type source/drain extended region. The N-type source/drain extended region may be formed through a cold temperature implantation of antimony (Sb). The cold temperature implantation may be performed in the range of approximately −200° C. to approximately 0° C.

A spacer (i.e., a sidewall spacer) is formed on the sidewalls of the gate structure in step 14. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

An N-type source/drain region is formed in step 15R. An implantation of an N-type species is performed to form the N-type source/drain region. The implantation may be performed by using the gate structure and the spacer as masks. Arsenic (As) may be implanted to form the N-type source/drain region. The N-type source/drain region may be formed through a room temperature implantation of arsenic (As). The room temperature implantation may be performed in the range of approximately 0° C. to approximately 30° C.

According to FIG. 3, the hot temperature implantation is performed to form the P-type halo region, and the cold temperature implantation is performed to form the N-type source/drain extended region. The room temperature implantation is performed to form the N-type source/drain region.

Figure 4:
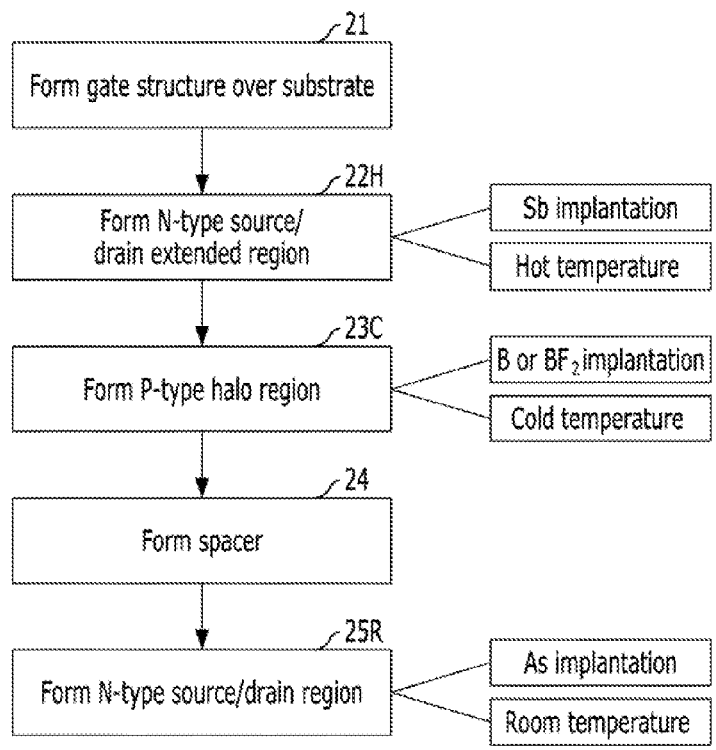

Referring to FIG. 4, a gate structure is formed over a substrate in step 21.

An N-type source/drain extended region is formed in the substrate in step 22H. An implantation of an N-type species is performed to form the N-type source/drain extended region. The implantation may be performed by using the gate structure as a mask. An antimony (Sb) implantation may be performed to form the N-type source/drain extended region. The N-type source/drain extended region may be formed through a hot temperature implantation of antimony (Sb). The hot temperature implantation may be performed in the range of approximately 50° C. to approximately 500° C.

A P-type halo region is formed in the substrate in step 23C. An implantation of a P-type species is performed to form the P-type halo region. For example, an implantation of boron (B) or boron difluoride ($BF_2$) is performed to form the P-type halo region. The P-type halo region may be formed through a cold temperature implantation. The cold temperature implantation may be performed in the range of approximately −200° C. to approximately 0° C. In another embodiment of the present invention, the cold temperature implantation of indium (In) may be performed to form the P-type halo region. In another embodiment of the present invention, the cold temperature implantation of a mixture of boron (B) and indium (In) may be performed to form the P-type halo region. For example, a boron (B) implantation and an indium (In) implantation may be sequentially performed at a cold temperature.

A spacer (i.e., a sidewall spacer) is formed on the sidewalls of the gate structure in step 24. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

An N-type source/drain region is formed in step 25R. An implantation of an N-type species is performed to form the N-type source/drain region. The implantation may be performed by using the gate structure and the spacer as masks. Arsenic (As) may be implanted to form the N-type source/drain region. The N-type source/drain region may be formed through a room temperature implantation of arsenic (As). The room temperature implantation may be performed in the range of approximately 0° C. to approximately 30° C.

According to FIG. 4, the cold temperature implantation is performed to form the P-type halo region, and the hot temperature implantation is performed to form the N-type source/drain extended region. The room temperature implantation is performed to form the N-type source/drain region. The hot temperature implantation for forming the N-type source/drain extended region of step 22H precedes the cold temperature implantation for forming the P-type halo region of step 23C.

Figure 5:
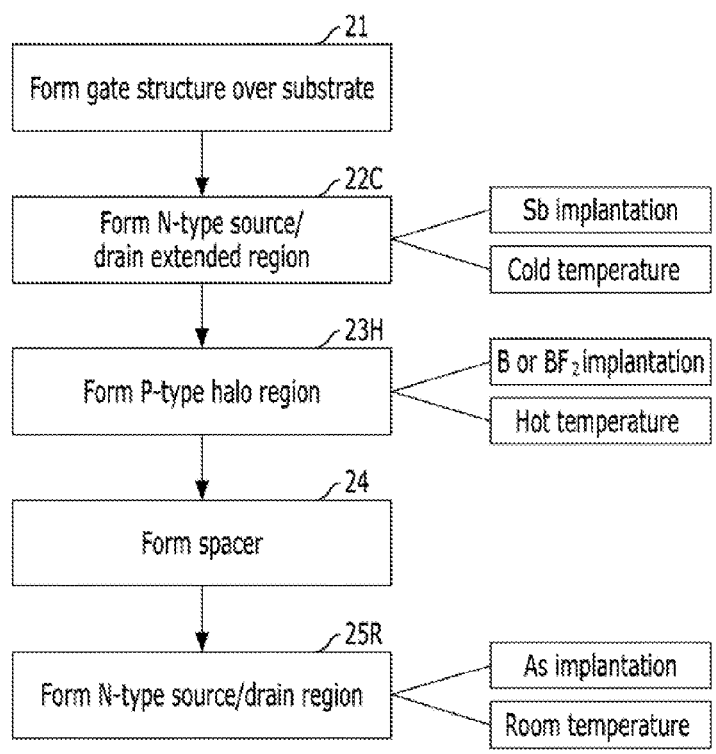

Referring to FIG. 5, a gate structure is formed over a substrate in step 21.

An N-type source/drain extended region is formed in step 22C. An implantation of an N-type species is performed to form the N-type source/drain extended region. The implantation may be performed by using the gate structure as a mask. An antimony (Sb) implantation may be performed to form the N-type source/drain extended region. The N-type source/drain extended region may be formed through a cold temperature implantation of antimony (Sb). The cold temperature implantation may be performed in the range of approximately −200° C. to approximately 0° C.

A P-type halo region is formed in the substrate in step 23H. An implantation of a P-type species is performed to form the P-type halo region. For example, an implantation of boron (B) or boron difluoride ($BF_2$) is performed to form the P-type halo region. The P-type halo region may be formed through a hot temperature implantation. In another embodiment of the present invention, the hot temperature implantation of indium (In) may be performed to form the P-type halo region. In another embodiment of the present invention, the hot temperature implantation of a mixture of boron (B) and indium (In) may be performed to form the P-type halo region. The hot temperature implantation may be performed in the range of approximately 50° C. to approximately 500° C.

A spacer (i.e., a sidewall spacer) is formed on the sidewalls of the gate structure in step 24. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

An N-type source/drain region is formed in step 25R. An implantation of an N-type species is performed to form the N-type source/drain region. The implantation may be performed by using the gate structure and the spacer as masks. Arsenic (As) may be implanted to form the N-type source/ drain region. The N-type source/drain region may be formed through a room temperature implantation of arsenic (As). The room temperature implantation may be performed in the range of approximately 0° C. to approximately 30° C.

According to FIG. 5, the hot temperature implantation is performed to form the P-type halo region, and the cold temperature implantation is performed to form the N-type source/drain extended region. The room temperature implantation is performed to form the N-type source/drain region. The cold temperature implantation for forming the N-type source/drain extended region of step 22C precedes the hot temperature implantation for forming the P-type halo region of step 23H.

Figure 6:
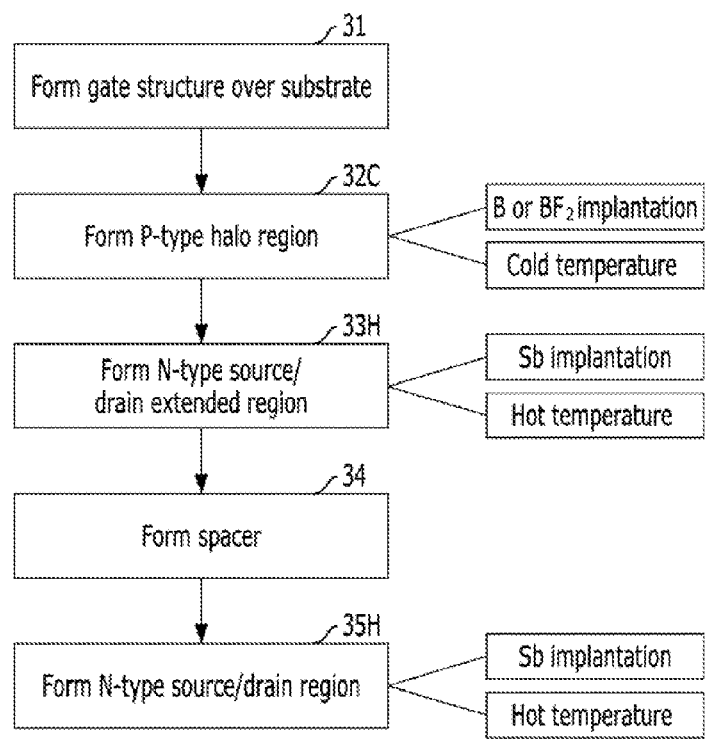

Referring to FIG. 6, a gate structure is formed over a substrate in step 31.

A P-type halo region is formed in the substrate in step 32C. An implantation of a P-type species is performed to form the P-type halo region. For example, an implantation of boron (B) or boron difluoride ($BF_2$) is performed to form the P-type halo region. The P-type halo region may be formed through a cold temperature implantation. In another embodiment of the present invention, the cold temperature implantation of indium (In) may be performed to form the P-type halo region. In another embodiment of the present invention, the cold temperature implantation of a mixture of boron (B) and indium (In) may be performed to form the P-type halo region.

An N-type source/drain extended region is formed in step 33H. An implantation of an N-type species is performed to form the N-type source/drain extended region. The implantation may be performed by using the gate structure as a mask. An antimony (Sb) implantation may be performed to form the N-type source/drain extended region. The N-type source/drain extended region may be formed through a hot temperature implantation of antimony (Sb).

A spacer (i.e., a sidewall spacer) is formed on the sidewalls of the gate structure in step 34. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

An N-type source/drain region is formed in step 35H. A hot temperature implantation of an N-type species is performed to form the N-type source/drain region. The hot temperature implantation may be performed by using the gate structure and the spacer as masks. The hot temperature implantation of antimony (Sb) may be performed to form the N-type source/drain region. The hot temperature implantation may be performed in the range of approximately 50° C. to approximately 500° C.

According to FIG. 6, the cold temperature implantation is performed to form the P-type halo region, and the hot temperature implantation of antimony (Sb) is performed to form the N-type source/drain extended region and the N-type source/drain region. In another embodiment of the present invention, the N-type source/drain extended region may be formed through the hot temperature implantation, and the N-type source/drain region may be formed through the cold temperature implantation.

Figure 7:
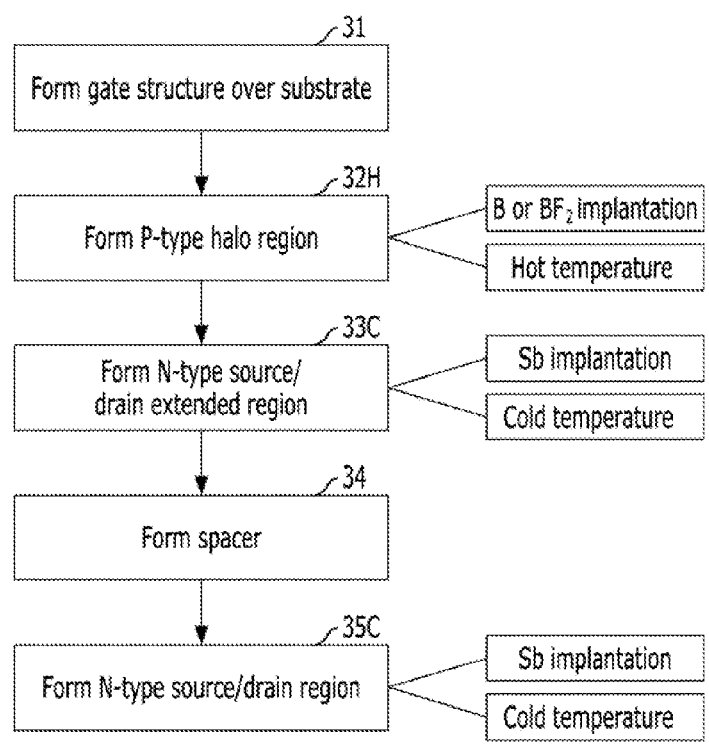

Referring to FIG. 7, a gate structure is formed over a substrate in step 31.

A P-type halo region is formed in the substrate in step 32H. An implantation of a P-type species is performed to form the P-type halo region. For example, an implantation of boron (B) or boron difluoride ($BF_2$) is performed to form the P-type halo region. The P-type halo region may be formed through a hot temperature implantation. In another embodiment of the present invention, the hot temperature implantation of indium (In) may be performed to form the P-type halo region. In another embodiment of the present invention, the hot temperature implantation of a mixture of boron (B) and indium (In) may be performed to form the P-type halo region.

An N-type source/drain extended region is formed in step 33C. An implantation of an N-type species is performed to form the N-type source/drain extended region. The implantation may be performed by using the gate structure as a mask. An antimony (Sb) implantation may be performed to form the N-type source/drain extended region. The N-type source/drain extended region may be formed through a cold temperature implantation of antimony (Sb).

A spacer (i.e., a sidewall spacer) is formed on the sidewalls of the gate structure in step 34. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

An N-type source/drain region is formed in step 35C. A cold temperature implantation of an N-type species is performed to form the N-type source/drain region. The cold temperature implantation may be performed by using the gate structure and the spacer as masks. The cold temperature implantation of antimony (Sb) may be performed to form the N-type source/drain region. The cold temperature implantation may be performed in the range of approximately −200° C. to approximately 0° C.

According to FIG. 7, the hot temperature implantation is performed to form the P-type halo region, and the cold temperature implantation of antimony (Sb) is performed to form the N-type source/drain extended region and the N-type source/drain region. In another embodiment of the present invention, the N-type source/drain extended may be formed through the cold temperature implantation, and the N-type source/drain region may be formed through the hot temperature implantation.

Figure 8A:
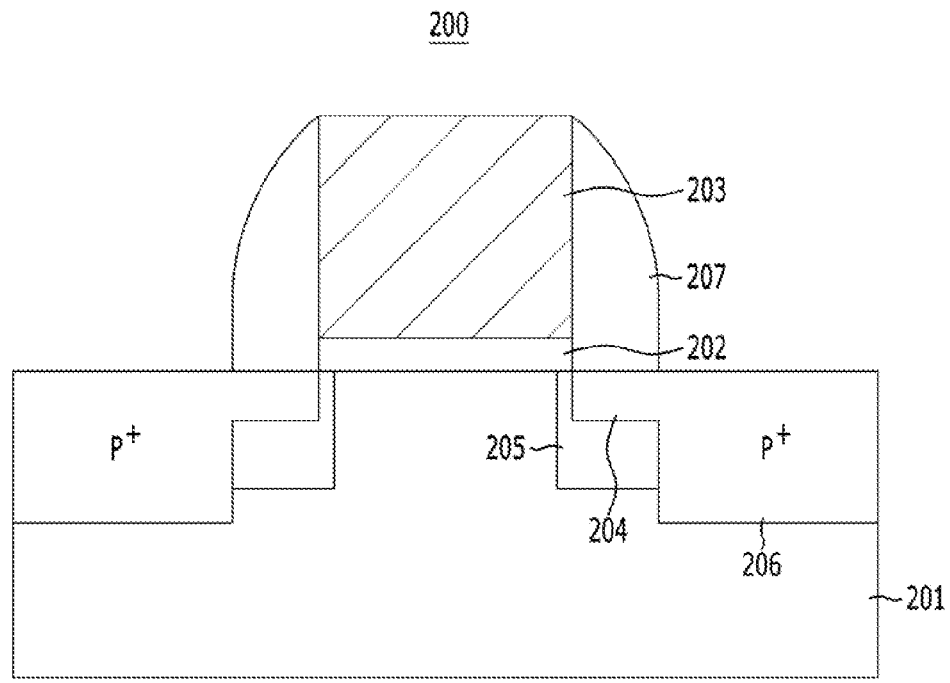
FIG. 8A illustrates a transistor in accordance with a second embodiment of the present invention.
Figure 8B:
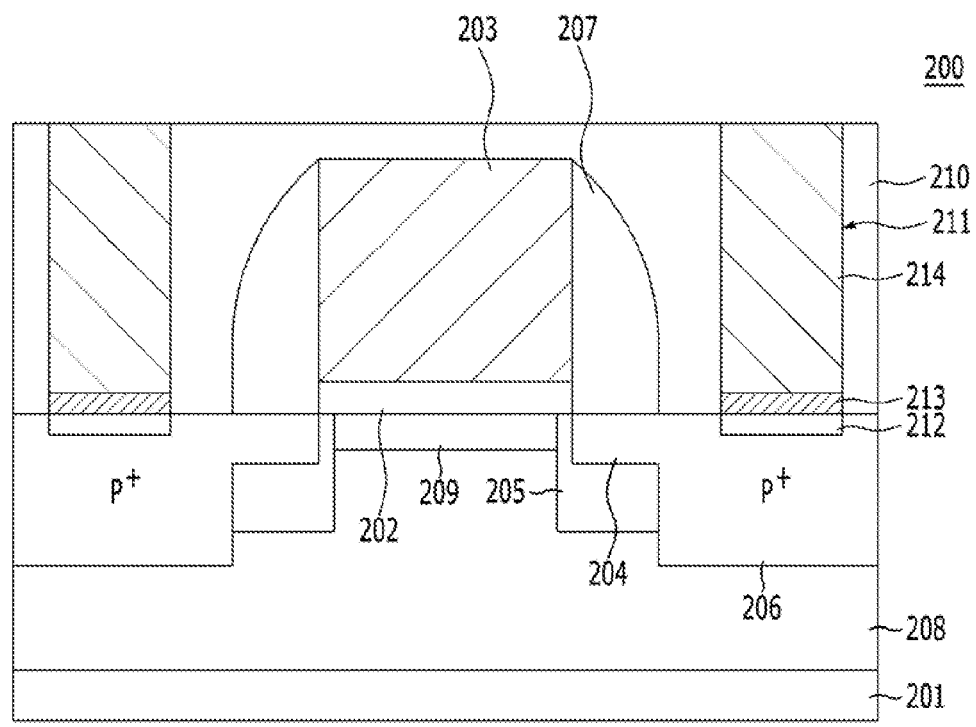
FIG. 8B illustrates a transistor in accordance with a modified example of the second embodiment of the present invention.

FIG. 8A illustrates a transistor in accordance with a second embodiment of the present invention. FIG. 8B illustrates a transistor in accordance with a modified example of the second embodiment of the present invention.

Referring to FIG. 8A, a transistor 200 includes a gate structure including a gate electrode 203, a P-type source/drain extended region 204, an N-type halo region 205, and a P-type source/drain region 206.

The gate structure is formed over a substrate 201. The substrate 201 may include a semiconductor substrate. The substrate 201 may include a silicon substrate, a silicon-germanium substrate or an SOI substrate. Herein, in the embodiment of the present invention, the substrate 201 may include the silicon substrate.

The gate structure may further include a gate insulation layer 202, and the gate electrode 203 is formed over the gate insulation layer 202. A spacer (i.e., a sidewall spacer) 207 is formed on the sidewalls of the gate structure. The gate insulation layer 202 may include at least one selected among a high-k material, an oxide, a nitride and an oxynitride. The high-k material may be a dielectric material having a higher dielectric constant than an oxide and a nitride. For example, the high-k material may be at least one selected among a metal oxide, such as a hafnium oxide or an aluminum oxide. The gate electrode 203 may include at least one selected among polysilicon, a metal and a metal compound. The gate electrode 203 may be formed of a work function material capable of controlling a threshold voltage of the transistor 200.

The P-type source/drain extended region 204 is formed in the substrate 201 on both sides of the gate structure. The P-type source/drain region 206 is formed to be adjacent to the P-type source/drain extended region 204. The N-type halo region 205 is formed below the N P-type source/drain extended region 204. The P-type source/drain extended region 204 is formed to be aligned to the gate electrode 203 in the substrate 201. The P-type source/drain region 206 is formed to be aligned to the gate electrode 203 and the spacer 207 in the substrate 201. The P-type source/drain extended region 204 has a first depth, and the P-type source/drain region 206 has a second depth deeper than the first depth. The N-type halo region 205 may have a third depth, which is deeper than the first depth and is shallower than the second depth. A first species is introduced to the P-type source/drain extended region 204. A third species is introduced to the P-type source/drain region 206. A second species is introduced to the N-type halo region 205. The first species and the third species may include a group V element, and the second species may include a group III element. The second species may include antimony (Sb), and the first and third species may include boron (B) or indium (In). The P-type source/drain extended region 204 is doped with the first species of a relatively low concentration. The P-type source/drain region 206 is doped with the third species of a relatively high concentration. The P-type source/drain extended region 204 may be referred to as a P-type Lightly Doped Drain (LDD) region. Therefore, the transistor 200 becomes a P-channel transistor. The N-type halo region 205 may be referred to as an N-type pocket region.

An implantation of the species may be performed to form the P-type source/drain extended region 204, the N-type halo region 205 and the P-type source/drain region 206.

A hot temperature implantation or a cold temperature implantation may be performed to form the P-type source/drain extended region 204 and the N-type halo region 205. A room temperature implantation, the hot temperature implantation or the cold temperature implantation may be performed to form the P-type source/drain region 206. The hot temperature implantation is a process in which the species is implanted at a temperature higher than a room temperature. The cold temperature implantation is a process in which the species is implanted at a temperature lower than a room temperature. The hot temperature implantation may be performed in the range of approximately 50° C. to approximately 500° C. The cold temperature implantation may be performed in the range of approximately −200° C. to approximately 0° C.

As described above, a hybrid implantation where the cold temperature implantation and the hot temperature implantation are combined is performed to form the P-type source/drain extended region 204 and the N-type halo region 205. The electric field crowding of a region where a PN junction is formed is relaxed through the hot temperature implantation, and the concentration is reduced through the cold temperature implantation. As a result, a GIDL may be improved through the hybrid implantation without deterioration of a short-channel margin.

Referring to FIG. 8B, an N-type well region 208 is formed in the substrate 201. A P-channel region 209 is formed in the N-type well region 208 below the gate structure. A contact plug 214 is formed over the P-type source/drain region 206. A contact hole 211, which is formed in an inter-layer dielectric layer 210, is filled with the contact plug 214. A metal silicide layer 213 is formed between the contact plug 214 and the P-type source/drain region 206. A contact junction region 212 is formed between the metal silicide layer 213 and the P-type source/drain region 206. The N-type well region 208, the P-channel region 209 and the contact junction region 212 may be formed through the implantation of the species. The room temperature implantation, the hot temperature implantation and the cold temperature implantation may be selectively performed to form the N-type well region 208, the P-channel region 209 and the contact junction region 212. For example, the hot temperature implantation or cold temperature implantation of an N-type species may be selectively performed to the P-channel region 209 and the N-type well region 208.

As described above, an off-leakage and a GIDL may be improved by controlling a defect as the hot temperature implantation or the cold temperature implantation is performed to the P-channel region 209 and the N-type well region 208. Additionally, a short-channel margin such as a Drain Induced Barrier Lowering (DIBL) may be improved by controlling a dopant profile. Further, the mobility based on a decrease in a counter-type dopant distribution of the P-channel region 209 may be improved.

A contact resistance may be improved by applying the hot temperature implantation or the cold temperature implantation to the contact junction region 212.

FIGS. 9 to 12 are flowcharts illustrating a method for fabricating the P-channel transistor in accordance with the second embodiment of the present invention.

Figure 9:
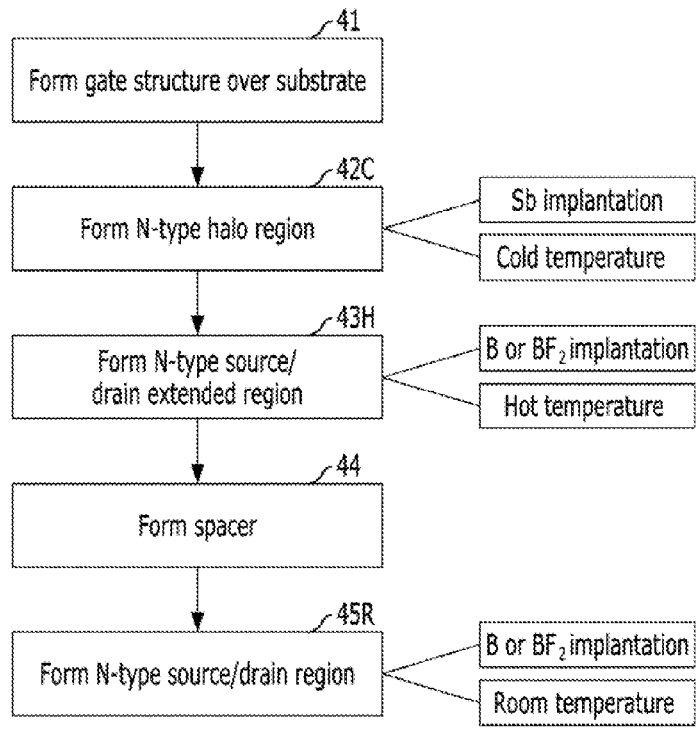
FIGS. 9 to 12 are flowcharts illustrating various methods for fabricating the transistor in accordance with the second embodiment of the present invention.

Referring to FIG. 9, a gate structure is formed over a substrate in step 41.

An N-type halo region is formed in the substrate in step 42C. An implantation of an N-type species is performed to form the N-type halo region. For example, antimony (Sb) is implanted to form the N-type halo region. The N-type halo region may be formed through a cold temperature implantation. The cold temperature implantation may be performed in the range of approximately −200° C. to approximately 0° C.

A P-type source/drain extended region is formed in step 43H. An implantation of a P-type species is performed to form the P-type source/drain extended region. The implantation may be performed by using the gate structure as a mask. A boron (B) implantation may be performed to form the P-type source/drain extended region. The P-type source/drain extended region may be formed through a hot temperature implantation of boron (B). The hot temperature implantation may be performed in the range of approximately 50° C. to approximately 500° C.

A spacer (i.e., a sidewall spacer) is formed on the sidewalls of the gate structure in step 44. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

A P-type source/drain region is formed in step 45R. An implantation of a P-type species is performed to form the P-type source/drain region. The implantation may be performed by using the gate structure and the spacer as masks. Boron (B) may be implanted to form the P-type source/drain region. The P-type source/drain region may be formed through a room temperature implantation of boron (B). The room temperature implantation may be performed in the range of approximately 0° C. to approximately 30° C.

According to FIG. 9, the cold temperature implantation is performed to form the N-type halo region, and the hot temperature implantation is performed to form the P-type source/drain extended region. The room temperature implantation is performed to form the P-type source/drain region.

Figure 10:
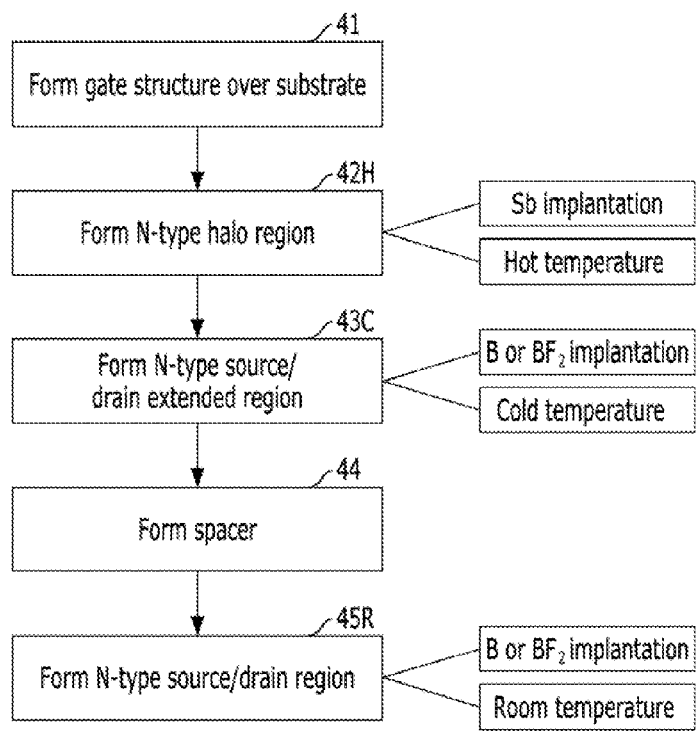

A method for fabricating the P-channel transistor shown in FIG. 10 is similar to the method shown in FIG. 9.

Referring to FIG. 10, a gate structure is formed over a substrate in step 41.

An N-type halo region is formed in the substrate in step 42H. An implantation of an N-type species is performed to form the N-type halo region. For example, antimony (Sb) is implanted to form the N-type halo region. The N-type halo region may be formed through a hot temperature implantation. The hot temperature implantation may be performed in the range of approximately 50° C. to approximately 500° C.

A P-type source/drain extended region is formed in step 43C. An implantation of a P-type species is performed to form the P-type source/drain extended region. The implantation may be performed by using the gate structure as a mask. A boron (B) implantation may be performed to form the P-type source/drain extended region. The P-type source/drain extended region may be formed through a cold temperature implantation of boron (B). The cold temperature implantation may be performed in the range of approximately −200° C. to approximately 0° C.

A spacer (i.e., a sidewall spacer) is formed on the sidewalls of the gate structure in step 44. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

A P-type source/drain region is formed in step 45R. An implantation of a P-type species is performed to form the P-type source/drain region. The implantation may be performed by using the gate structure and the spacer as masks. Boron (B) may be implanted to form the P-type source/drain region. The P-type source/drain region may be formed through a room temperature implantation of boron (B). The room temperature implantation may be performed in the range of approximately 0° C. to approximately 30° C.

According to FIG. 10, the hot temperature implantation is performed to form the N-type halo region, and the cold temperature implantation is performed to form the P-type source/drain extended region. The room temperature implantation is performed to form the P-type source/drain region.

Figure 11:
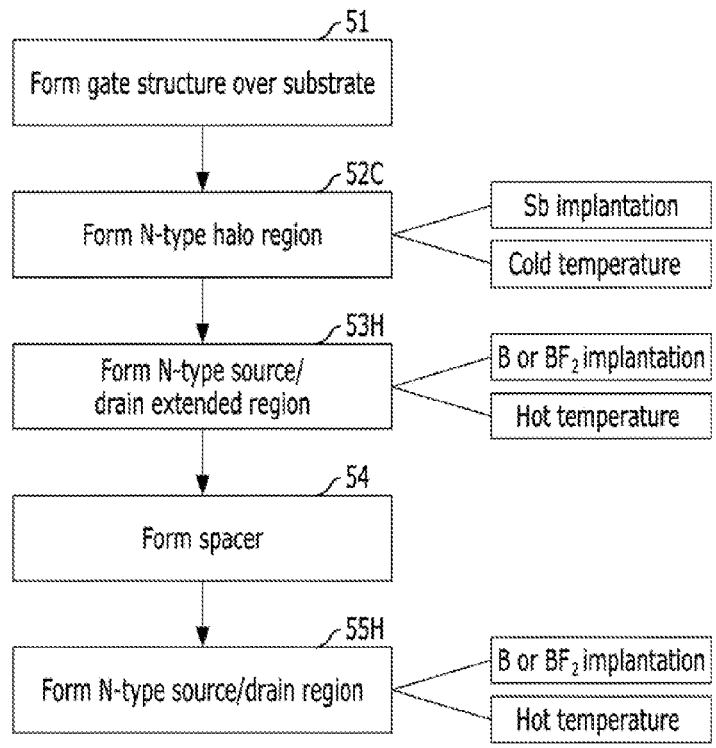
Figure 12:
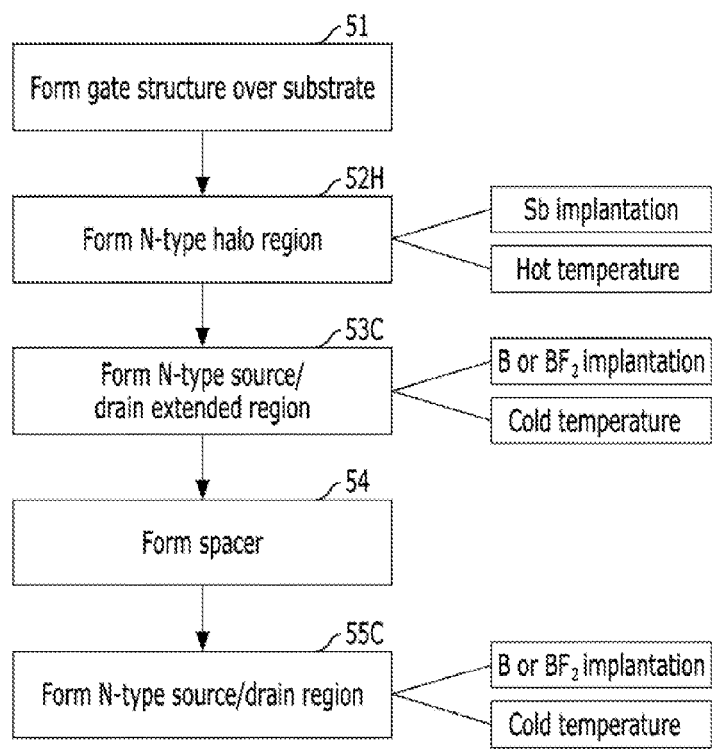

In the method for fabricating the P-channel transistor shown in FIGS. 11 and 12, the hot temperature implantation or the cold temperature implantation is performed to form the P-type source/drain region.

Referring to FIG. 11, a gate structure is formed over a substrate in step 51.

An N-type halo region is formed in the substrate in step 52C. An implantation of an N-type species is performed to form the N-type halo region. For example, antimony (Sb) is implanted to form the N-type halo region. The N-type halo region may be formed through a cold temperature implantation. The cold temperature implantation may be performed in the range of approximately −200° C. to approximately 0° C.

A P-type source/drain extended region is formed in the substrate in step 53H. An implantation of a P-type species is performed to form the P-type source/drain extended region. The implantation may be performed by using the gate structure as a mask. A boron (B) implantation may be performed to form the P-type source/drain extended region.

The P-type source/drain extended region may be formed through a hot temperature implantation of boron (B). The hot temperature implantation may be performed in the range of approximately 50° C. to approximately 500° C.

A spacer (i.e., a sidewall spacer) is formed on the sidewalls of the gate structure in step 54. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

A P-type source/drain region is formed in step 55H. An implantation of a P-type species is performed to form the P-type source/drain region. The implantation may be performed by using the gate structure and the spacer as masks. Boron (B) may be implanted to form the P-type source/drain region. The P-type source/drain region may be formed through a hot temperature implantation of boron (B). The hot temperature implantation may be performed in the range of approximately 50° C. to approximately 500° C.

According to FIG. 11, the cold temperature implantation is performed to form the N-type halo region, and the hot temperature implantation is performed to form the P-type source/drain extended region and the P-type source/drain region. In another embodiment of the present invention, the P-type source/drain extended region may be formed through the hot temperature implantation, and the P-type source/drain region may be formed through the cold temperature implantation.

Referring to FIG. 12, a gate structure is formed over a substrate in step 51.

An N-type halo region is formed in the substrate in step 52H. An implantation of an N-type species is performed to form the N-type halo region. For example, antimony (Sb) is implanted to form the N-type halo region. The N-type halo region may be formed through a hot temperature implantation. The hot temperature implantation may be performed in the range of approximately 50° C. to approximately 500° C.

A P-type source/drain extended region is formed in step 53C. An implantation of a P-type species is performed to form the P-type source/drain extended region. The implantation may be performed by using the gate structure as a mask. A boron (B) implantation may be performed to form the P-type source/drain extended region. The P-type source/drain extended region may be formed through a cold temperature implantation of boron (B). The cold temperature implantation may be performed in the range of approximately −200° C. to approximately 0° C.

A spacer (i.e., a sidewall spacer) is formed on the sidewalls of the gate structure in step 54. A deposition and an etch-back process of a spacer layer may be performed to form the spacer. The spacer may include a silicon oxide or a silicon nitride. In another embodiment of the present invention, the spacer may be a multi-layered spacer including a silicon oxide and a silicon nitride.

A P-type source/drain region is formed in step 55C. An implantation of a P-type species is performed to form the P-type source/drain region. The implantation may be performed by using the gate structure and the spacer as masks. Boron (B) may be implanted to form the P-type source/drain region. The P-type source/drain region may be formed through a cold temperature implantation of boron (B). The cold temperature implantation may be performed in the range of approximately −200° C. to approximately 0° C.

According to FIG. 12, the hot temperature implantation is performed to form the N-type halo region, and the cold temperature implantation is performed to form the P-type source/drain extended region and the P-type source/drain region. In another embodiment of the present invention, the P-type source/drain extended region may be formed through the cold temperature implantation, and the P-type source/drain region may be formed through the hot temperature implantation.

In FIGS. 9 to 12, the step of forming the N-type halo region may be switched with the step of forming the P-type source/drain extended region.

Figure 13:
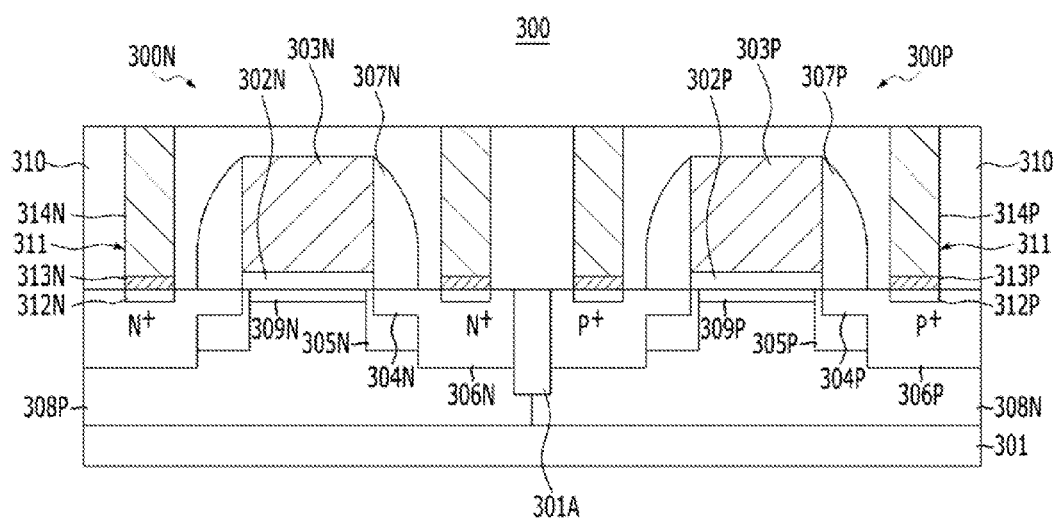
FIG. 13 illustrates a semiconductor device including the transistors in accordance with the embodiments of the present invention.

FIG. 13 illustrates a semiconductor device including the transistors in accordance with the embodiments of the present invention. FIG. 13 illustrates a CMOSFET.

Referring to FIG. 13, a CMOSFET 300 includes an N-channel transistor 300N and a P-channel transistor 300P. The N-channel transistor 300N and the P-channel transistor 300P are isolated from each other by an isolation layer 301A. The N-channel transistor 300N is formed in a P-type well region 308P. The P-channel transistor 300P is formed in an N-type well region 308N.

The N-channel transistor 300N includes a gate structure including a first gate insulation layer 302N and a first gate electrode 303N, an N-type source/drain extended region 304N, a P-type halo region 305N, and an N-type source/drain region 306N. The P-type well region 308P is formed in a substrate 301. An N-channel region 309N is formed in the P-type well region 308P below the gate structure. A first contact plug 314N is formed over the N-type source/drain region 306N. A contact hole 311, which is formed in an inter-layer dielectric layer 310, is filled with the first contact plug 314N. A first metal silicide layer 313N is formed between the first contact plug 314N and the N-type source/drain region 306N. A first contact junction region 312N is formed between the first metal silicide layer 313N and the N-type source/drain region 306N.

The P-channel transistor 300P includes a gate structure including a second gate insulation layer 302P and a second gate electrode 303P, a P-type source/drain extended region 304P, an N-type halo region 305P, and a P-type source/drain region 306P. The N-type well region 308N is formed in the substrate 301. A P-channel region 309P is formed in the N-type well region 308N below the gate structure. A second contact plug 314P is formed over the P-type source/drain region 306P. The contact hole 311, which is formed in the inter-layer dielectric layer 310, is filled with the second contact plug 314P. A second metal silicide layer 313P is formed between the second contact plug 314P and the P-type source/drain region 306P. A second contact junction region 312P is formed between the second metal silicide layer 313P and the P-type source/drain region 306P.

A hot temperature implantation or a cold temperature implantation may be performed to form the N-type source/drain extended region 304N and the P-type halo region 305N. The hot temperature implantation, the cold temperature implantation and a room temperature implantation may be performed to form the N-type source/drain region 306N.

The hot temperature implantation or the cold temperature implantation may be performed to form the P-type source/drain extended region 304P and the N-type halo region 305P. The hot temperature implantation, the cold temperature implantation and the room temperature implantation may be performed to form the P-type source/drain region 306P.

The hot temperature implantation or the cold temperature implantation may be performed to form the P-type well region 308P, the N-channel region 309N, the N-type well region 308N, the P-channel region 309P, the first contact junction region 312N or the second contact junction region 312P.

The performance of the CMOSFET 300 may be improved as an on-current is improved.

Figure 14:
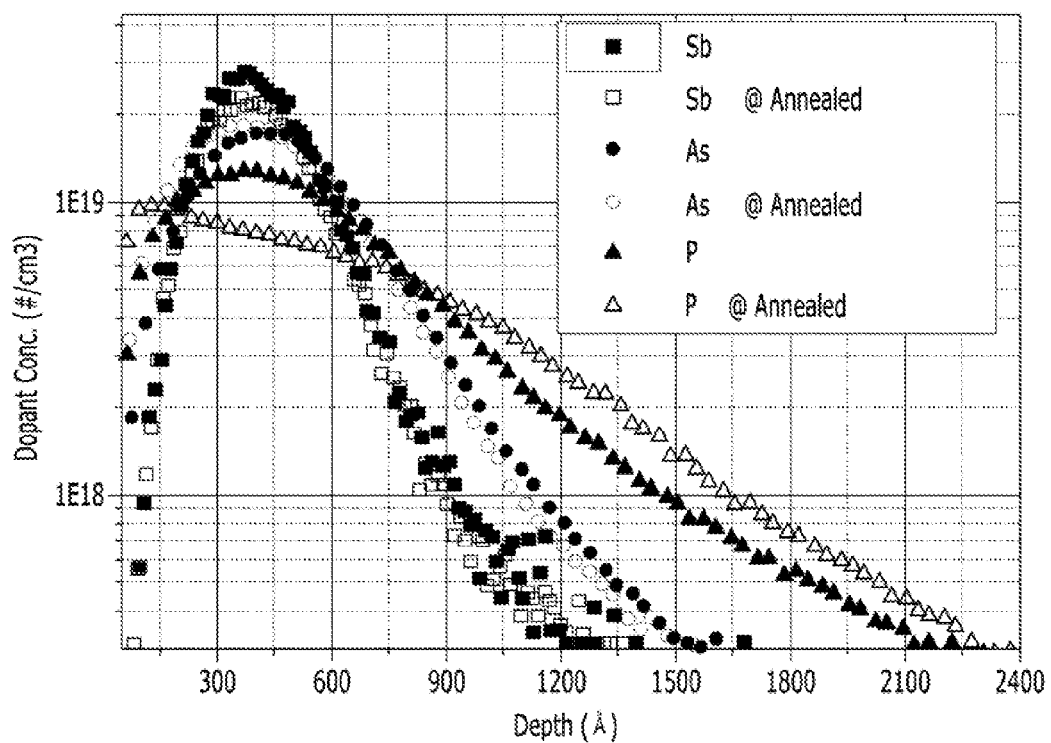
FIG. 14 illustrates doping concentration profiles of N-type species.

FIG. 14 illustrates doping concentration profiles of N-type species. FIG. 14 illustrates an antimony profile and an arsenic profile with a phosphorus profile.

Referring to FIG. 14, antimony (Sb) may be formed at a shallower depth than phosphorus (P) and arsenic (As). Phosphorus (P) deteriorates a short-channel margin since phosphorus (P) has a higher diffusion degree than antimony (Sb) and arsenic (As).

Figure 15:
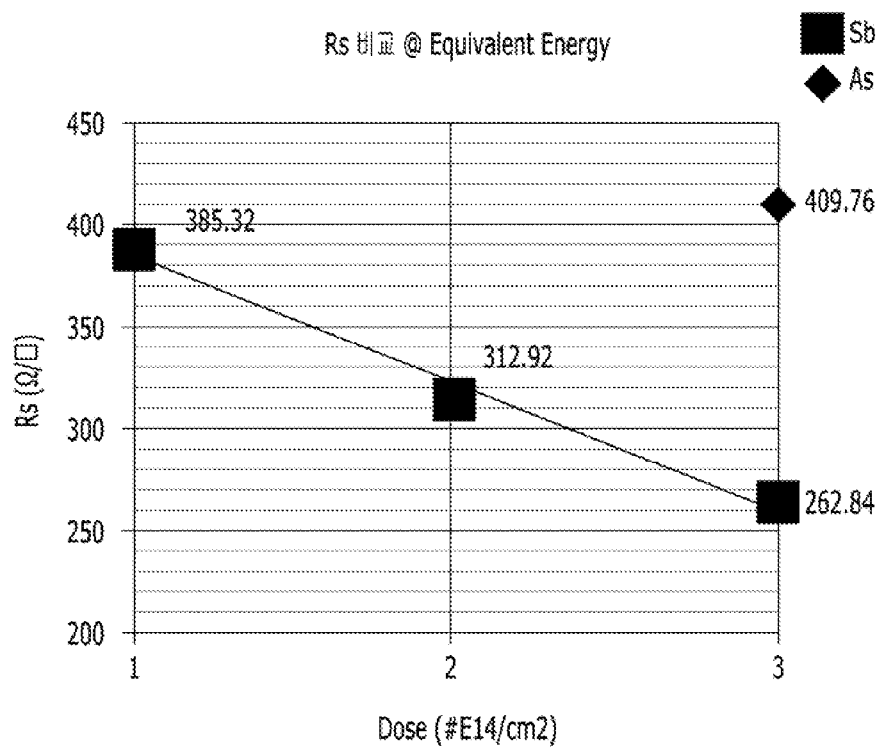
FIG. 15 illustrates sheet resistances of an antimony implantation and an arsenic implantation.

FIG. 15 illustrates sheet resistances of an antimony implantation and an arsenic implantation. The sheet resistance of a region where arsenic (As) is implanted is greater than the sheet resistance of a region where antimony (Sb) is implanted. When the same implantation energy is applied, the antimony implantation may improve the sheet resistance approximately 35% more than the arsenic implantation.

Figure 16:
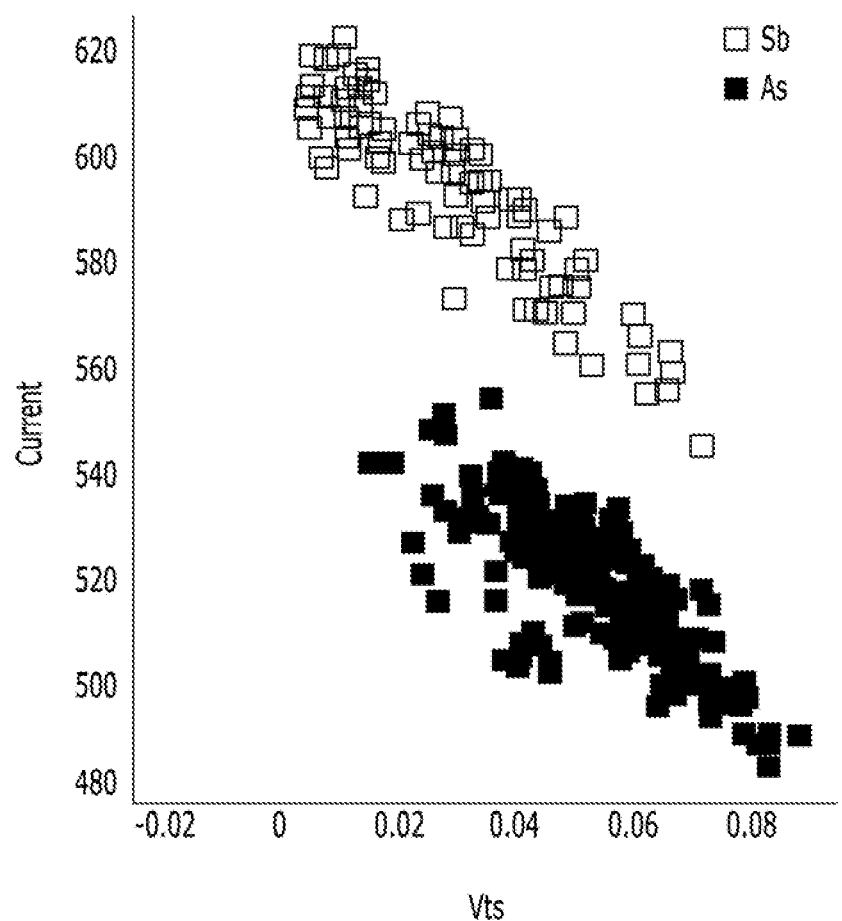
FIG. 16 illustrates on-currents of an antimony implantation and an arsenic implantation.

FIG. 16 illustrates a comparison of on-currents of an antimony implantation and an arsenic implantation. The on-current is repeatedly measured by controlling a threshold voltage Vts in various ways. The dose of the antimony implantation is identical to the dose of the arsenic implantation. The on-current of the threshold voltage Vts is linearly changed.

Referring to FIG. 16, an on-current value obtained through the antimony implantation is higher than an on-current value obtained through the arsenic implantation. When the antimony implantation is performed, the on-current may be improved approximately 10%.

Figure 17:
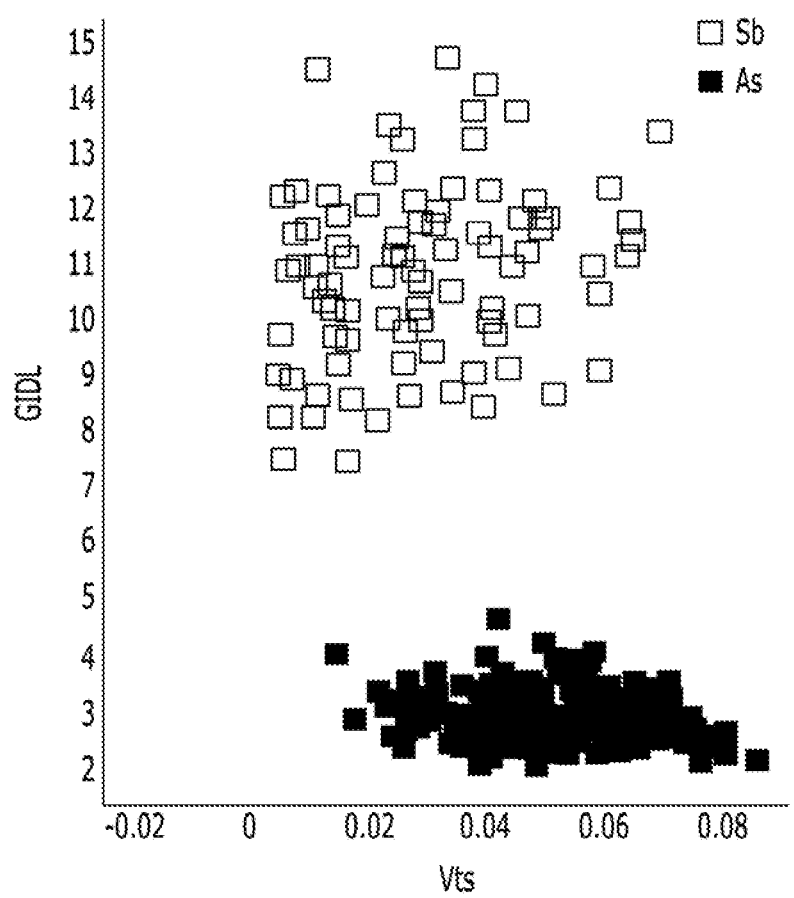
FIG. 17 illustrates gate-induced drain leakages of an antimony implantation and an arsenic implantation.
Figure 18:
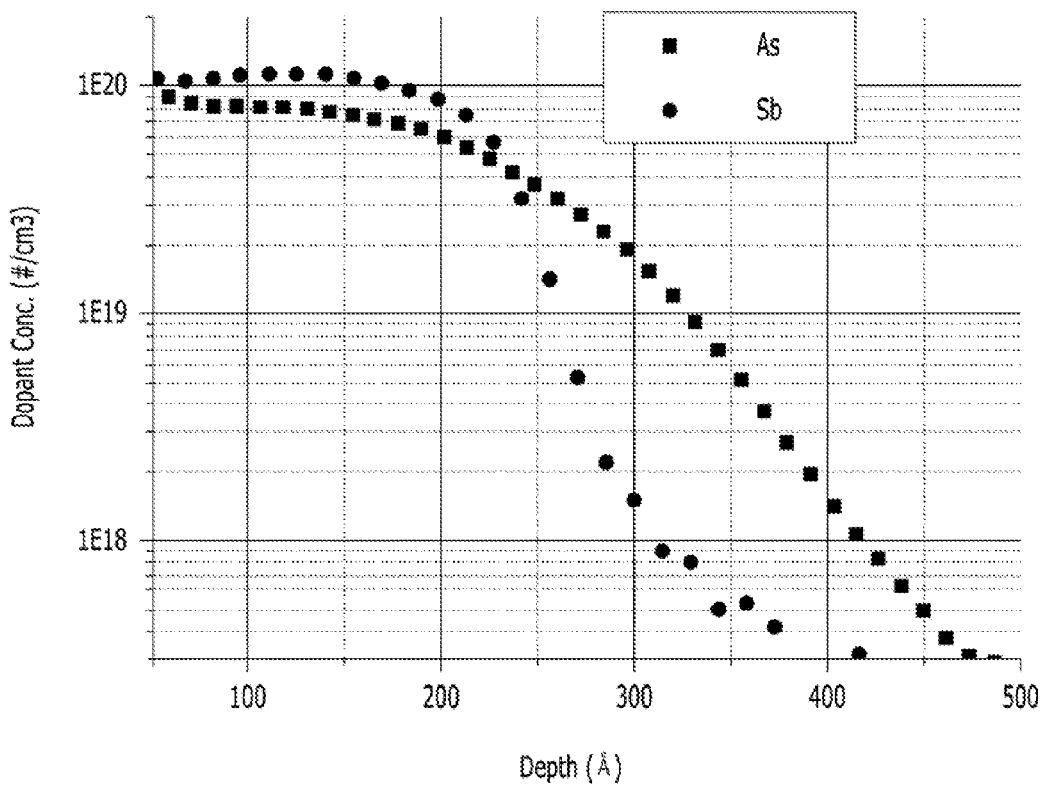
FIG. 18 illustrates a doping profile for a gate-induced drain leakage.

FIG. 17 illustrates GIDL of an antimony implantation and an arsenic implantation. FIG. 18 illustrates a doping profile for the gate-induced drain leakage. Referring to FIG. 17, the gate-induced drain leakage of the antimony implantation is deteriorated more greatly than the gate-induced drain leakage of the arsenic implantation. The antimony implantation has a steep doping profile in comparison with the arsenic implantation. Consequently, the gate-induced drain leakage is deteriorated.

The embodiments of the present invention apply the hot temperature implantation as the antimony implantation. As a broadened doping profile is formed, the arsenic implantation is improved.

Figure 19:
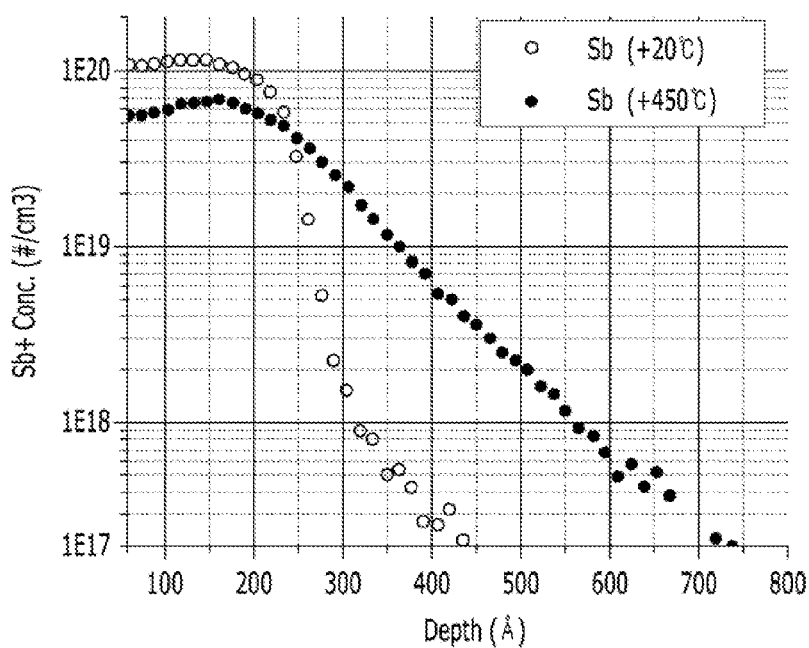
FIG. 19 illustrates a doping profile of antimony based on an implantation temperature condition.

FIG. 19 illustrates a doping profile of antimony based on an implantation temperature condition. Referring to FIG. 19, when the temperature of the antimony implantation is changed from a room temperature 20° C. to a hot temperature 450° C., a broadened doping profile may be obtained.

Figure 20:
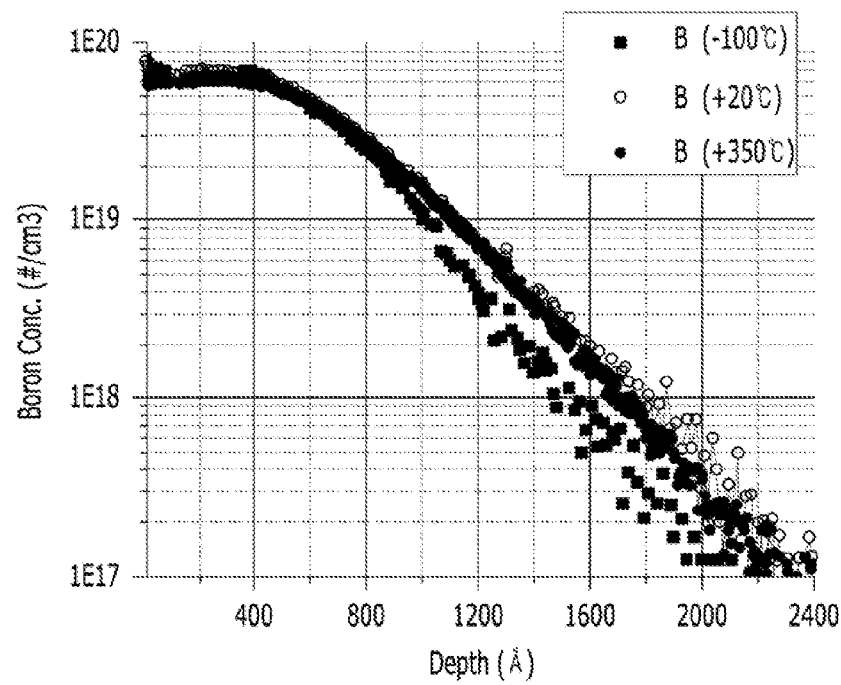
FIG. 20 illustrates a doping profile of boron based on an implantation temperature condition.

FIG. 20 illustrates a doping profile of boron based on an implantation temperature condition. Referring to FIG. 20, when the temperature of the boron implantation is changed from a room temperature 20° C. to a cold temperature −100° C., a suppressed doping profile may be obtained.

Figure 21:
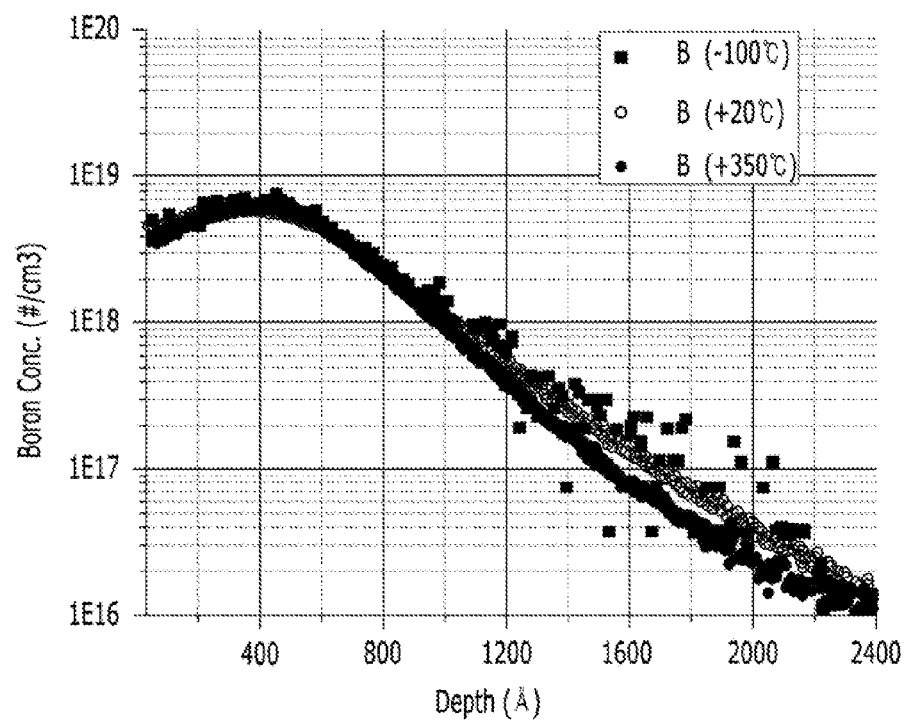
FIGS. 21 and 22 each illustrate a junction depth of boron based on an implantation temperature condition and a dose.
Figure 22:
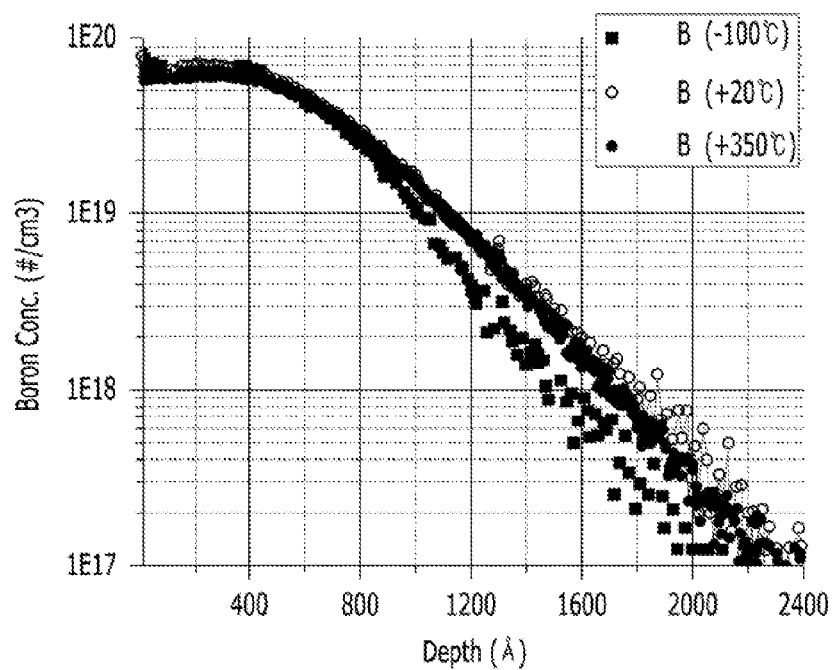

FIGS. 21 and 22 illustrate a junction depth of boron based on an implantation temperature condition and a dose. FIG. 21 shows a case in which a dose of the boron implantation is set at 5E13 ions/cm$^2$, and FIG. 22 shows a case in which a dose of the boron implantation is set at 5E14 ions/cm$^2$.

Referring to FIGS. 21 and 22, when the boron implantation is performed with a low dose 5E13 ions/cm$^2$, boron has a shallower junction depth as the implantation temperature decreases. When the boron implantation is performed with a medium dose 5E14 ions/cm$^2$, boron has a shallower junction depth as the implantation temperature increases.

Figure 23:
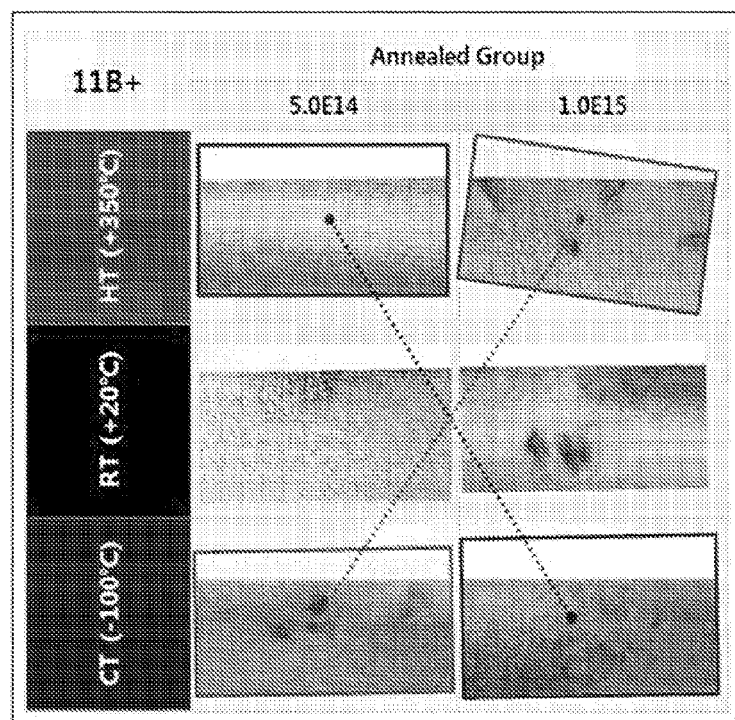
FIG. 23 illustrates defects of a boron implantation according to temperatures and doses.

FIG. 23 illustrates defects of a boron implantation according to temperatures and doses.

Referring to FIG. 23, there are a few defects as a hot temperature implantation is performed at a low dose 5E14 ions/cm². There are a few defects as a cold temperature implantation is performed at a high dose 1E15 ions/cm².

The transistors in accordance with the embodiments of the present invention may be applied to integrated circuits including transistors for serving various purposes, e.g., an insulated gate FET (IGFET), a high electron mobility transistor (HEMT), a power transistor, a thin film transistor (TFT), etc.

The transistors and the integrated circuits in accordance with the embodiments of the present invention may be embedded in an electronic device. The electronic device may include a memory device and a non-memory device. The memory device includes an SRAM, a DRAM, a flash memory, an MRAM, an ReRAM, an STTRAM, an FeRAM, etc. The non-memory device includes a logic circuit. For controlling the memory device, the logic circuit may include a sense amplifier, a decoder, an input/output circuit, etc. Additionally, the logic circuit may include a variety of integrated circuits other than the memory. For example, the logic circuit may include a microprocessor, an application processor (AP) of a mobile device, etc. Furthermore, the non-memory device may include a logic gate such as a NAND gate, a driver integrated circuit for a display device, a power semiconductor device such as a power management integrated circuit (PMIC), etc. The electronic device may include a computing system, an image sensor, a camera, a mobile device, a display device, a sensor, a medical device, a photoelectronic device, a radio frequency identification (RFID), a solar battery, an automobile semiconductor device, a rolling stock semiconductor device, an aircraft semiconductor device, etc.

Figure 24:
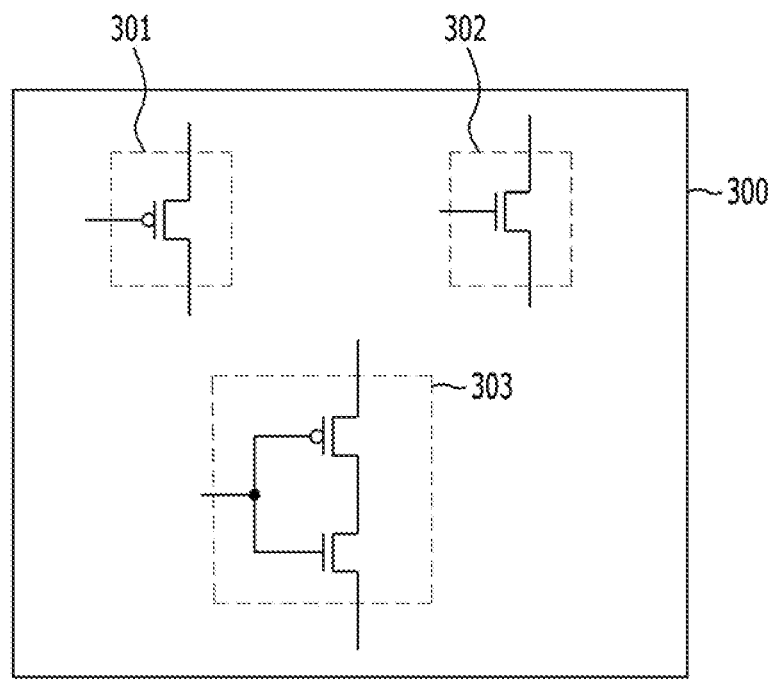
FIG. 24 illustrates an electronic device including the transistors in accordance with the embodiments of the present invention.

FIG. 24 illustrates an electronic device including the transistors in accordance with the embodiments of the present invention.

Referring to FIG. 24, an electronic device 300 includes a plurality of transistors. The electronic device 300 may include a plurality of PMOSFETs 301, a plurality of NMOSFETs 302 and a plurality of CMOSFETs 303. The PMOSFET 301, NMOSFET 302 and CMOSFET 303 may include the transistors in accordance with the embodiments of the present invention. Each transistor included in the electronic device 300 includes a source/drain extended region, a halo region and a source/drain region. A hybrid implantation in which a cold temperature implantation and a hot temperature implantation are combined, is performed to form the source/drain extended region and the halo region. The electric field crowding of a region where a PN junction is formed is relaxed through the hot temperature implantation, and the concentration is reduced through the cold temperature implantation. As a result, a GIDL may be improved through the hybrid implantation without deterioration of a short-channel margin. As the GIDL is improved, the performance of the transistor may be improved. The electronic device 300 including the transistor having improved performance may operate at a rapid operation rate in the industrial environment in which the transistor is being scaled down.

In accordance with the embodiments of the present invention, an on-current of a transistor may be improved without deterioration of a short-channel margin as a hybrid implantation in which a cold temperature implantation and a hot temperature implantation are combined, is performed to form a source/drain extended region and a halo region.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

What is claimed is:

1. A method for fabricating a transistor including a gate structure, a source/drain extended region, a source/drain region and a halo region, the method comprising:
   performing a hot temperature implantation using a first species to form the source/drain region having a broadened doping profile, wherein the hot temperature implantation is performed at a temperature higher than a room temperature;
   performing a cold temperature implantation using a second species to form the halo region having a suppressed doping profile, wherein the cold temperature implantation is performed at a temperature lower than the room temperature; and
   performing an additional hot temperature implantation using a third species to form the source/drain extended region,
   wherein the first species and the third species comprises the same material,
   wherein the halo region covers the source/drain extension region, and covers a side portion of the source/drain region that is adjacent to the gate structure, and
   wherein the source/drain region extension region contact with the side portion of the source/drain region, and has a depth shallower than the source/drain region.

2. The method of claim 1, wherein the first species includes a group III element, and the second species includes a group V element.

3. The method of claim 1, wherein the first species includes antimony (Sb), and the second species includes boron (B), indium (In), or a mixture of boron and indium.

4. The method of claim 1, wherein the cold temperature ranges from approximately −200° C. to approximately 0° C.

5. The method of claim 1, wherein the hot temperature ranges from approximately 50° C. to approximately 500° C.

6. The method of claim 1, wherein the first species includes a group V element, and the second species includes a group III element.

7. The method of claim 1, wherein the first species includes boron (B), indium (In), or a mixture of boron and indium, and the second species includes antimony (Sb).

8. A method for fabricating a transistor including a gate structure, a source/drain extended region, a source/drain region and a halo region, the method comprising:
   performing a hot temperature implantation using a first species to form the source/drain region having a broadened doping profile, wherein the hot temperature implantation is performed at a temperature higher than a room temperature;
   performing a cold temperature implantation using a second species to form the halo region having a suppressed doping profile, wherein the cold temperature implantation is performed at a temperature lower than the room temperature; and
   performing an additional cold temperature implantation using a third species to form the source/drain extended region,
   wherein the first species and the third species comprises the same material,
   wherein the halo region covers the source/drain extension region, and covers a side portion of the source/drain region that is adjacent to the gate structure, and wherein the source/drain region extension region contact with the side portion of the source/drain region, and has a depth shallower than the source/drain region.

* * * * *